US000001264H

United States Statutory Invention Registration [19]

[11] Reg. Number: H1264

[43] Published: Dec. 7, 1993

Epler et al.

[54] METHOD OF IN SITU STOICIOMETRIC AND GEOMETRICAL PHOTO INDUCED MODIFICATIONS TO COMPOUND THIN FILMS DURING EPITAXIAL GROWTH AND APPLICATIONS THEREOF

[75] Inventors: John E. Epler, Sunnyvale; Harlan F. Chung, Daily City; Thomas L. Paoli, Los Altos, all of Calif.

[73] Assignee: Xerox Corporation

[21] Appl. No.: 691,068

[22] Filed: Apr. 24, 1991

Related U.S. Application Data

[63] Continuation of Ser. No. 474,687, Jan. 31, 1990, abandoned, which is a continuation of Ser. No. 177,563, Apr. 4, 1988, abandoned.

[51] Int. Cl.[5] ..... H01L 21/20

[52] U.S. Cl. ..... 437/107; 437/133; 437/129

[58] Field of Search ..... 437/79, 81, 82, 107, 437/112, 173, 935, 943, 936, 963; 427/42, 43.1, 53.1; 156/610, 613, 614; 148/163.33, DIG. 41, DIG. 48, DIG. 56, DIG. 65, DIG. 71, DIG. 90, DIG. 94, DIG. 110

[56] References Cited

U.S. PATENT DOCUMENTS

| | | | |
|---|---|---|---|
| 4,071,383 | 1/1978 | Nagata et al. | 148/175 |
| 4,117,504 | 9/1978 | Maslov et al. | 357/16 |
| 4,292,091 | 9/1981 | Togei | 437/173 |
| 4,543,270 | 9/1985 | Oprysko et al. | 427/53.1 |
| 4,579,750 | 4/1986 | Bowen et al. | 427/53.1 |
| 4,581,248 | 4/1986 | Roche | 427/53.1 |
| 4,608,117 | 8/1986 | Ehrlich et al. | 156/610 |

(List continued on next page.)

OTHER PUBLICATIONS

Aoyagi et al., "Atomic-Layer Growth . . . Laser Metal-organic Vapor-Phase Epitaxy," J. Vac. Sci. Technol. B. 5(5), Sep./Oct. 1987, pp. 1460-1464.

Nishizawa, "Photo-Excited Molecular Layer Epitaxy . . . ", JEE, Oct. 1984, pp. 32-39.

(List continued on next page.)

*Primary Examiner*—Robert L. Stoll
*Assistant Examiner*—Joseph D. Anthony
*Attorney, Agent, or Firm*—W. Douglas Carothers, Jr.; Jonathan A. Small

[57] ABSTRACT

In situ geometrical and stoichiometric properties of deposited films are brought about by employing a scanned irradiation source directed to a spot which is scanned across the growth surface in a chemical vapor deposition reactor system, e.g., MOCVD system. Gaussian profile spot intensity variations or variations in the intensity of the source spot at selected regions at the growth surface will selectively enhance the deposition growth rate and/or in situ stoichiometric content of the deposited film. Selective monotonic increasing and decreasing changes in film thickness and stoichiometric content can be accomplished while the spot is scanned across the growth surface. Such changes or variations in film thickness and stoichiometric content are useful in fabricating semiconductor devices having regions of different bandgap and refractive index properties in one or more semiconductor layers of such devices. These property variations may be utilized to produce buried index waveguiding features in such devices and produce multiple emitters each having a different wavelength emission useful in printer and optical communication applications.

11 Claims, 10 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

U.S. PATENT DOCUMENTS

| | | | |
|---|---|---|---|
| 4,645,687 | 2/1987 | Donnelly et al. | 427/53.1 |
| 4,668,528 | 5/1987 | Ehrlich et al. | 427/53.1 |
| 4,678,536 | 7/1987 | Murayama et al. | 156/635 |
| 4,693,779 | 9/1987 | Okuhira et al. | 156/638 |
| 4,724,219 | 2/1988 | Ridinger | 437/19 |
| 4,726,320 | 2/1988 | Ichikawa | 118/722 |
| 4,843,031 | 6/1989 | Ban et al. | 437/173 |
| 4,885,260 | 12/1989 | Ban et al. | 437/173 |

OTHER PUBLICATIONS

York et al., Low-Temperature Laser Photochemical Vapor Deposition of GaAs, Appl. Phys. Lett. vol. 54, No. 19, 8 May 1989, pp. 1866-1868.

Sudarsan et al., Ultraviolet Laser-Induced Low-Temperature Epitaxy of GaP, Appl. Phys. Lett. vol. 55, No. 8, 21 Aug. 1989, pp. 738-740.

W. Roth et al., "Laser Stimulated Growth of Epitaxial GaAs", *Materials Research Society Symposia Proceedings* entitled Laser Diagnostics and Photochemical Processing for Semiconductor Devices, vol. 17, pp. 193-198, North-Holland, Publisher (1988)*.

W. D. Goodhue et al., "Planar Quantum Wells With Spatially Dependent Thicknesses and Al Content", *Journal of Vacuum Science Technology,* vol. B 6(3), pp. 846-849, May/Jun. 1988.

J. E. Epler et al., "AlGaAs Multiple Wavelength Light Emitting Bar Grown by Laser Assisted Metalorganic Chemical Vapor Deposition", *Applied Physics Letters,* vol. 52(18), May 2, 1988.

W. Roth et al., "GaAs Mesa Diodes made by Direct Writing Laser Stimulated MOCVD", Microelectronics Journal, vol. 15(1), pp. 26-29, 1984.

Pending patent application of William D. Goodhue entitled "Tapered Laser or Waveguide Optoelectronic Structures and Method", M.I.T. Case No. 4577.

*Optics and Laser Technology,* Part One: vol. 18(6), pp. 313-317, Dec., 1986.

*Optics and Laser Technology,* Part Two: vol. 19(1), pp. 19-25, Feb. 1987.

*Optics and Laser Technology,* Part Three: vol. 19(2), pp. 75-82, Apr., 1987.

W. Roth et al, *Material Resource Society Symposium Proceedings,* vol. 17, p. 793, 1983.

Aoyagi et al., "Laser Enhanced Matalorganic Chemical Vapor Deposition Crystal Growth in GaAs", *Applied Physics Letters,* vol. 47(2), pp. 95-96, Jul. 15, 1985.

S. M. Bedair et al., "Laser Selective Deposition of GaAs on Si", *Applied Physics Letters,* vol. 48(2), pp. 174-176, Jan. 13, 1986.

H. Kukimoto et al., "Selective Area Control of Material Properties in Laser-Assisted MOCPE of GaAs and AlGaAs" *Journal of Crystal Growth,* vol. 77(1-3), pp. 223-228, Sep., 1986.

T. Soga et al, "High Temperature Growth Rate in MOCVD Growth of AlGaAs" *Journal of Crystal Growth,* vol. 68(1), pp. 169-175, Sep., 1984.

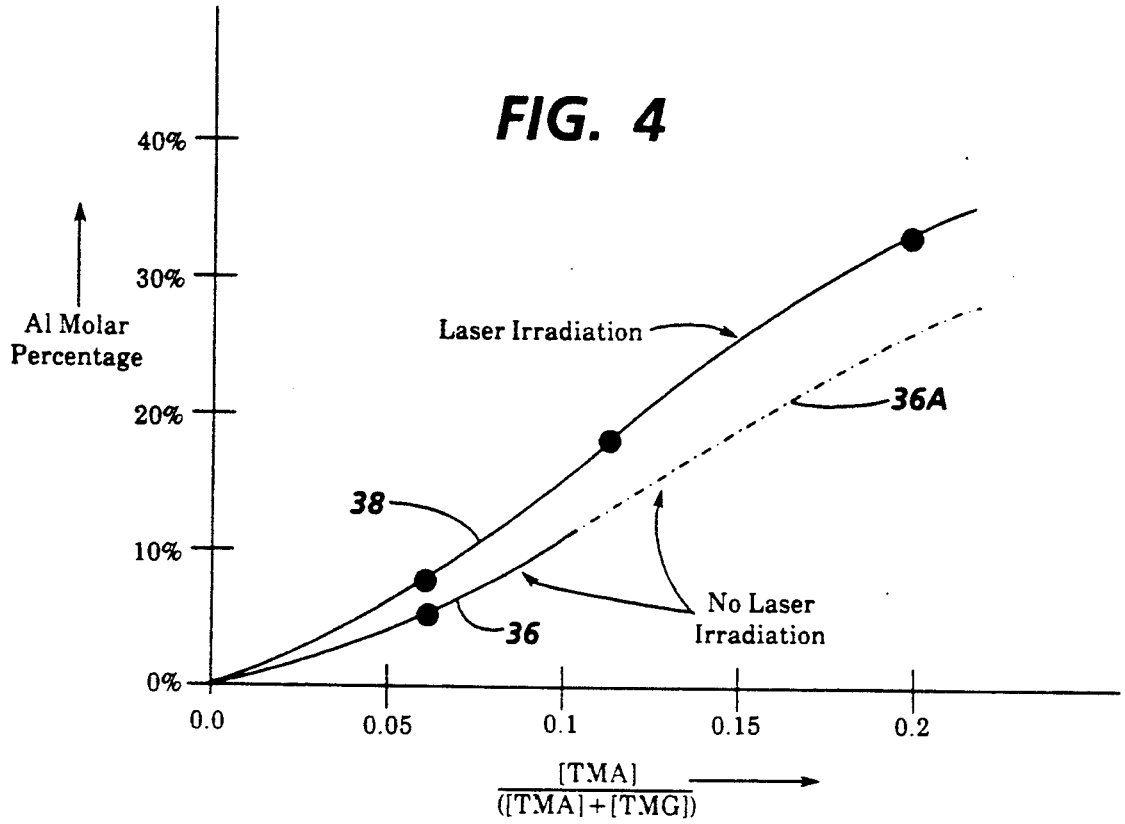
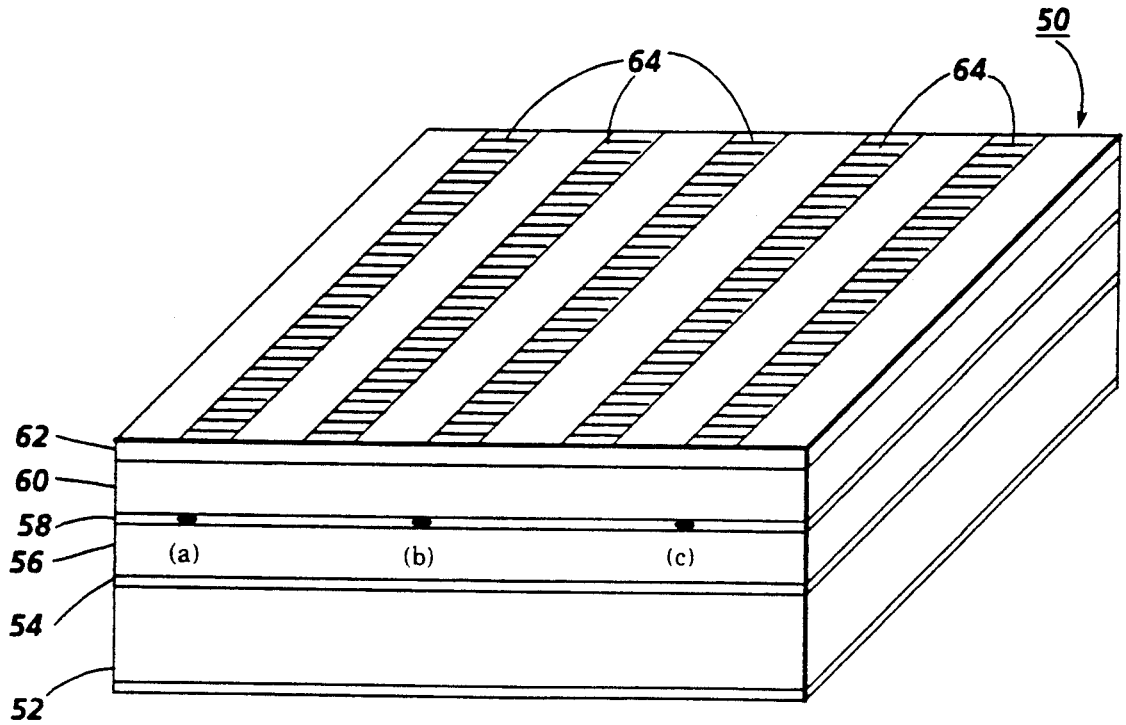
FIG. 6

METHOD OF IN SITU STOICIOMETRIC AND GEOMETRICAL PHOTO INDUCED MODIFICATIONS TO COMPOUND THIN FILMS DURING EPITAXIAL GROWTH AND APPLICATIONS THEREOF

GOVERNMENT RIGHTS

The Government has certain rights in this invention pursuant to Contract No. 86F173100 awarded by the Defense Advanced Research Projects Agency (DARPA).

This is a continuation of application Ser. No. 07/474,687, filed Jan. 31, 1990, now abandoned, which is a continuation of application Ser. No. 07/177,563, filed Apr. 4, 1988, now abandoned.

BACKGROUND OF THE INVENTION

This invention relates generally to the vapor deposition of thin films and more particularly to a method of changing or modifying properties of the growth of semiconductor materials during epitaxial growth via chemical vapor deposition (CVD) and more specifically to a method of making in situ stoichiometric (e.g., atomic molar fraction changes) and geometrical (e.g., layer thickness changes) modifications to binary, ternary and other compound semiconductor thin films, such as, II-VI or III-V compounds (e.g., GaAs) or alloys (e.g. GaAlAs), during their epitaxial growth (e.g., metalorganic vapor phase epitaxy or metalorganic chemical vapor deposition, i.e., (MOVPE or MOCVD).

Much work is being accomplished at this point in time relative to the use of photo assistance during the CVD-of thin films of materials. Such processing has been referred to as laser CVD or LCVD, or laser assisted or induced CVD. A recent publication summarizes much of this work and refers to it as "laser microchemical processing": F. Micheli and I. W. Boyd, "Laser Microfabrication of Thin Films: Part One, Part Two and Part Three", *Optics and Laser Technology*, Part One:Vol. 18(6), pp. 313-317, December 1986; Part Two: Vol. 19(1), pp. 19-25, February, 1987; and Part Three: Vol. 19(2), pp. 75-82, April, 1987. References in the patent literature include methods of selective depositing primarily via pyrolysis, e.g., U.S. Pat. No. 4,543,270; via photolysis, e.g., U.S. Pat. Nos. 4,608,117; 4,668,528; 4,678,536; 4,693,779 and 4,726,320; or via a combination of photolysis and pyrolysis, e.g., U.S. Pat. Nos. 4,579,750 and 4,581,248.

Laser assisted molecular beam epitaxy (MBE) has been proposed and developed as exemplified in U.S. Pat. No. 4,071,383 to Nagata et al. Nagata et al. discloses selective stoichiometric changes in an epitaxially deposited film in MBE wherein higher refractive index material is produced in beam irradiated areas of the depositing film as compared to unirradiated areas producing an optical embedded waveguide. Laser assisted metalorganic chemical vapor deposition (MOCVD) is now being developed as a versatile means of patterning the growth of III-V compounds. In a typical laser assisted MOCVD process, an in situ laser beam is irradiated onto a portion of a substrate during growth. Depending upon the optical intensity of the beam and substrate temperature, the laser radiation photochemically and/or photothermally increases the crystal growth rate. In this manner, selective growth of GaAs has been demonstrated with a wide range of photon energies (2.4-6.4 eV) and optical intensities. See, for example, the articles of W. Roth et al,. laser stimulated growth of Epitaxial GaAs *Material Resource Society Symposium Proceeding*, entitled "Laser Diagnostics and Photochemical Processing for Semiconductor Devices," Vol. 17, pp. 193-198, 1983; Y. Aoyagi et al, *Applied Physics Letters*, Vol. 47(2), pp. 95-96, Jul. 15, 1985; S. M. Bedair et al, *Applied Physics Letters*, Vol. 48(2), pp. 174-176, Jan. 13, 1986, H. Kukimoto et al, *Journal of Crystal Growth*, Vol. 77(1-3), pp. 223-228, Sep. 1986; and T. Soga et al, *Journal of Crystal Growth*, Vol. 68(1), pp. 169-175, September, 1984.

Selective growth of the ternary compounds GaAsP ($\lambda$=514.5 nm) and GaAlAs ($\lambda$=248 nm) via laser assisted MOCVD is respectively demonstrated in S. M. Bedair et al and H. Kukimoto et al. Not only is the growth rate increased for ternary compounds, but also the stoichiometry is affected by the laser radiation. For example, in Kukimoto et al, a slight increase in Al incorporation has been shown to be induced with excimer radiation (193 nm) during the epitaxial growth of GaAlAs. The Al content in this ternary was shown to increase in irradiated areas compared to unirradiated areas of the depositing film. Also, the Al content incorporation increased slightly with temperatures in the range of 600° C. to just over 700° C. These stoichiometric changes in the growth of GaAlAs occurred at temperatures at about 600° C. and below and these stoichiometric changes occurred for different transport rate ratios of the deposition gases involved. It was further observed by Kukimoto et al that the growth ratios for GaAs and GaAlAs layers were not influenced by laser irradiation at growth temperatures higher than 600° C. Kukimoto et al suggests that selective area control of material properties, i.e., the selective control of Al content in the growth of GaAlAs, has potential for fabrication of various semiconductor devices because the selective differences in Al molar fraction during growth brings local differences in optical properties, such as refractive index and in electrical properties, such as energy bandgap of the material. Since laser assisted MOCVD enhances the incorporation of Al during the growth of GaAlAs, such laser assistance processing may be used to locally vary the bandgap of a GaAlAs layer or thin film by controlling the content of Al incorporated into the thin film via optical illumination applied in situ during epitaxial growth.

The recently issued patent to Maslov et al, U.S. Pat. No. 4,117,504, is an example of another method for bringing about stoichiometric change during epitaxial growth but does not involve photo assisted CVD. Maslov et al discloses apparatus for the solid state evaporation of sequentially aligned semiconductor compound materials as the same are transversely passed in opposed relation to a heated substrate. As a result, a thin film is deposited on the substrate having a monotonically increasing stoichiometric change in deposited material laterally across the substrate surface. This change is referred to as a composition gradient and an example in the patent disclosure is a stoichiometric change across a deposited thin film from GaAs to $GaAs_{0.64}P_{0.36}$.

It is an object of this invention to bring about in situ stoichiometric and growth rate changes in compound semiconductors employing photo assisted MOCVD epitaxy and to apply this method of photo assisted MOCVD epitaxy in the fabrication of devices, such as multiple wavelength light emitting LED'S, semiconductor lasers or laser arrays.

SUMMARY OF THE INVENTION

According to this invention, in situ geometrical and stoichiometric properties of deposited films are brought about by employing a scanned irradiation source directed to a spot which is scanned across the growth surface in a chemical vapor deposition reactor system, e.g., MOCVD system. Gaussian profile spot intensity variations or variations in the intensity of the source spot at selected regions at the growth surface will selectively enhance the deposition growth rate and/or in situ stoichiometric content of the deposited film. Selective monotonic increasing and decreasing changes in film thickness and stoichiometric content can be accomplished while the spot is scanned across the growth surface. Such changes or variations in film thickness and stoichiometric content are useful in fabricating semiconductor devices having regions of different bandgap and refractive index properties in one or more semiconductor layers of such devices. These property variations may be utilized to produce buried index waveguiding features in such devices and produce multiple emitters each having a different wavelength emission useful in printer and optical communication applications.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 4 is graphical illustration of Al molar fraction in the irradiated and unirradiated regions of the deposited film as a function of different gas transport rate ratios.

FIG. 6 schematically illustrates a multiple wavelength LED array fabricated according to the method of this invention.

DETAILED DESCRIPTION OF THE PREFERRED EMBODIMENTS

Figure 1:
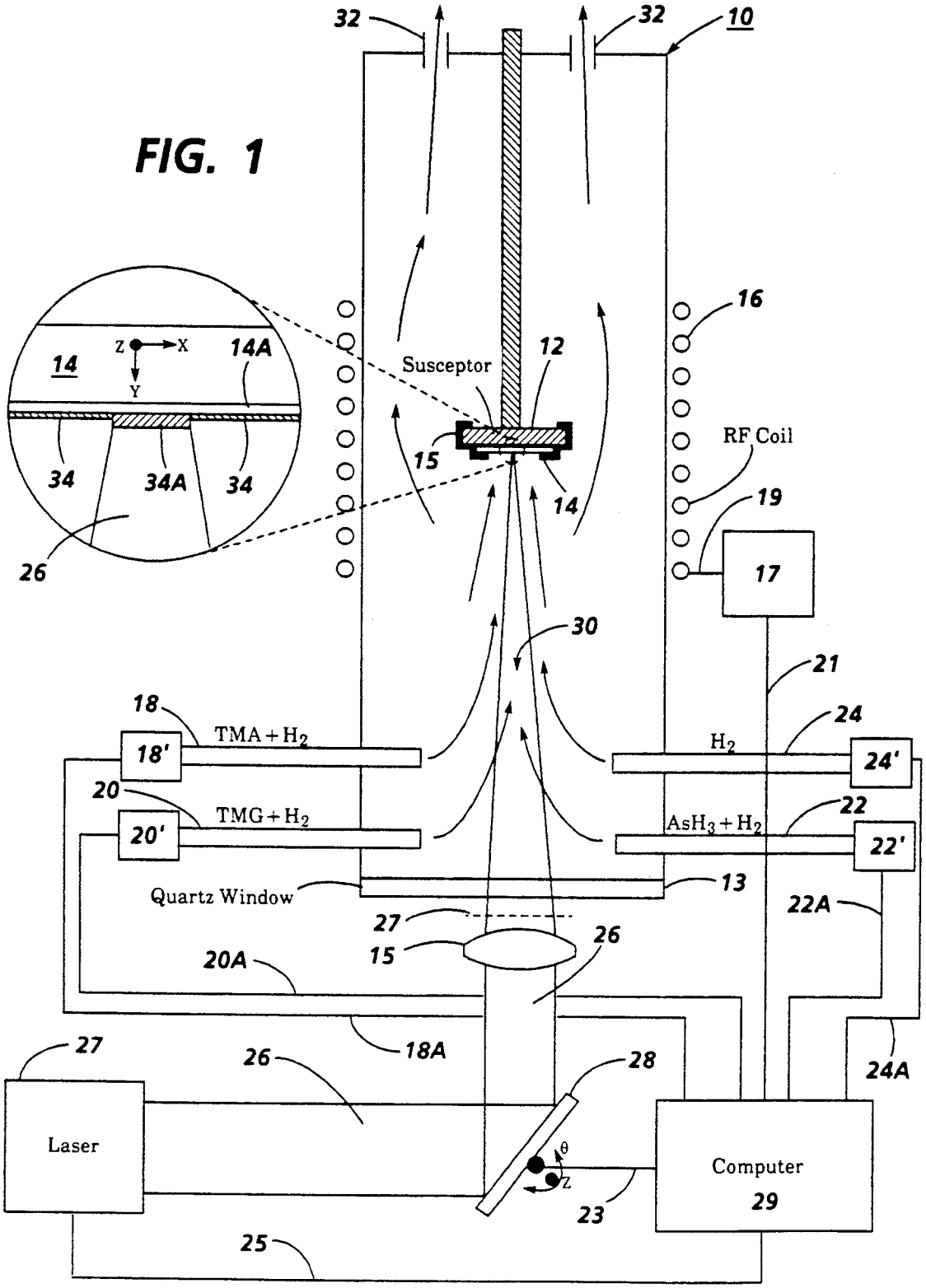
FIG. 1 schematically illustrates a laser assisted MOCVD reaction chamber utilized in the practice of this invention.

Reference is now made to FIG. 1 wherein there is shown a schematic diagram of a laser assisted growth chamber 10 used for MOCVD processing in the practice of this invention. Chamber 10 may be a quartz tube which includes a transparent quartz window 13 at its bottom with a graphite susceptor 12 suspended in chamber 10 on which a substrate 14 is supported and is held with a quartz supporting ring. Susceptor 12 is inductively heated with an external RF coil 16 connected by line 19 to RF controller 17 which is connected by line 21 to computer 29 to selectively vary, under programmed control, the temperature environment at the growth surface of substrate 14. Gas inlets 18, 20, 22 and 24 are located near the bottom of chamber 10 to provide for inlet, respectively, of sources of the gases trimethylaluminum (TAM), trimethyl-gallium (TMG), $AsH_3$, and $H_2$ as a carrier gas. These sources may also include dopants such as $H_2Se$. The flow rate, volume and composition of these source gases are maintained under programmed control by computer 29 via control lines 18A, 20A, 22A and 24A to gas sources 18', 20', 22', and 24'. These gases are mixed in the vicinity of inlets 18–24 at 30 and immediately flow upwardly in chamber 10, as indicated by the arrows in FIG. 1, and eventually exit the chamber at exit ports 32. The upward flow of the gas mixture prevents wall deposits on the bottom half of chamber 10.

The growth conditions for conventional MOCVD are observed and are well documented in the prior art. The gas mixture proceeds upwardly through chamber and a portion of the gases contact the major growth surface of substrate 14 and the metallic atoms condense or decompose from the reactant gas compounds on the growth surface as an epitaxially deposited film, e.g., GaAs when source 18 is shut off via computer 29, or GaAlAs when all sources 18–24 are in operation via computer 29.

The design of this MOCVD system provides clear optical access for a cw or pulsed $Ar^+(\lambda=514.5$ nm, $TEM_{00})$ laser beam 26 from laser 27 through quartz window 13 and focused via objective lens 15 onto the growth surface of substrate 14. Beam 26 obviously may be any other type of light energy generating source for causing photochemical and/or photothermal dissociation, such as, a masked mercury or xenon lamp source, or a $CO_2$ or excimer laser beam in the case of flood or lamp sources or a beam source with a large waist, the growth surface of substrate 14 may be exposed by such a flood irradiation source through a mask 27 having a predetermined pattern to selectively expose regions of the growth surface and photo assist epitaxial growth in those regions. In such a case, objective lens 15 would not be necessary.

Laser beam 26 may be focused to a 1.0 mm spot size and is centered on substrate 14 during the growth of the GaAs and GaAlAs layers. Laser beam 26 is scanned via scanner 28, illustrated as a galvanometer-controlled turning mirror. The laser spot may, for example, be slightly "vibrated" by galvanometer-controlled turning mirror 28 to spatially average any nonuniformity in optical intensity of beam 26. Mirror 28 may, alternately, be a rotating polygon. Mirror 28 may be operated by $\theta$ rotation to scan in the X direction and moved laterally in the Z plane to scan in the Z direction to obtain orthogonal scanning in the X-Z plane. Instead of mirror 28, two galvanometer-controlled turning mirrors may be utilized to obtain orthogonal scanning in the X-Z plane. Such a scanning system is manufactured by General Scanning, Inc., 500 Arsenal Street, Watertown, Mass. 02172. Further, scanner 28 may alternatively be a X-Z raster scan system with a rapid refresh rate. Lastly, to facilitate growth surface scanning, more than one beam may be focused to and scanned across the substrate surface. Multiple beam scanning may be provided with multiple beam sources or employing a beam splitter to produce multiple beams so that simultaneous exposure of different surface regions of substrate 14 may be accomplished at the same or different beam intensities. In the cases of all of the aforementioned beam type scanners, the refresh rate of the scanner has to be as fast as the growth rate processes occurring at the growth surface, which rate is several times a second or more specifically relative to MOCVD system 10, five times or more complete sweeps per second of the growth surface of substrate 14.

Laser 27 and scanner 28 are operated under computer programmed control via computer 29 wherein the beam intensity and beam ON and OFF states may be modulated via control line 25 to laser 27 and the X-Z pattern or path of scan of the beam spot on the growth surface at substrate 14 is controlled via control line 23 to scanner 28.

The inset in FIG. 1 is an enlargement of a region of substrate 14 including the point of focus of beam 26 onto the substrate growth surface. As shown in the inset, substrate 14 may be first provided with a prelayer 14A of GaAs or GaAlAs followed by the deposit of a film 34 of GaAs or GaAlAs. As depicted in the FIG. 1 inset for the case of a GaAlAs deposited film, if laser beam 26 of proper intensity, accompanied with proper substrate temperature at susceptor 12 and proper TMA gas transport ratio, [TMA]/([TMA]+[TMG]), the irradiated regions of film 34 of focused laser beam 26 will experience a higher overall film growth rate and/or content or incorporation of Al than adjacent unirradiated regions of film 34, as represented by the larger region 34A of film 34. Thus, with proper conditions present, region 34A illuminated by beam 26 will bring about an accelerated growth rate of GaAlAs film 34 by an increase in the rate of or alternative of reaction of the source gases at substrate 14.

Figure 2A:
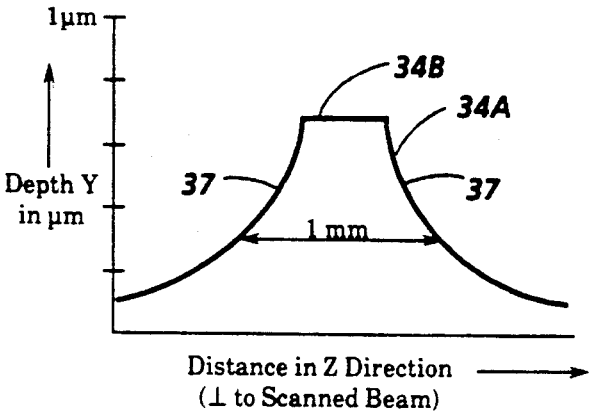
FIGS. 2A and 2B are height profiles in orthogonal directions showing a region of enhanced growth of a GaAlAs thin film irradiated with a laser beam during its growth.
Figure 2B:
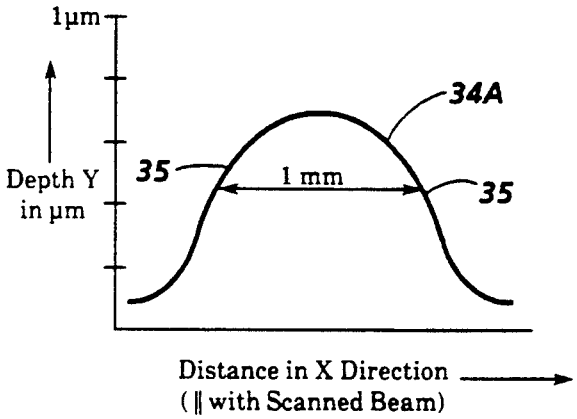

In FIGS. 2A and 2B, there are shown height profiles in orthogonal directions for an irradiated region 34A based upon a general outline from actual measurements of a GaAlAs film profile. The particular film 34 grown was $Ga_{0.6}Al_{0.4}As$, the laser power used was 1.5 W, the beam intensity was approximately 150 W/cm$^2$ and the substrate temperature, $T_s$, during growth was 580° C. To be noted in FIGS. 2A and 2B is the significant height of the growth obtained in the enhanced growth region 34A of film 34 irradiated by beam 26. FIG. 2A is a profile in the Z direction perpendicular to the scanned beam while FIG. 2B is a profile in the X direction parallel to the scanned beam. To be noted is the fairly flat top 34B of region 34A which is indicative of the saturation point of surface growth for the given growth conditions (beam intensity, gas transport rate ratio, source concentrations, gas flow rate and substrate temperature), i.e., the maximum amount of available source component molecules at the growth surface for given gas conditions. Also, the growth surfaces of region 34A in the parallel direction of scanned beam 26 of FIG. 2B contain more rounded or convex surfaces 35 in its profile compared to the concave growth surfaces 37 in the perpendicular direction of FIG. 2A due to the sweep-stop-reverse directional motion of the beam.

Figure 3:
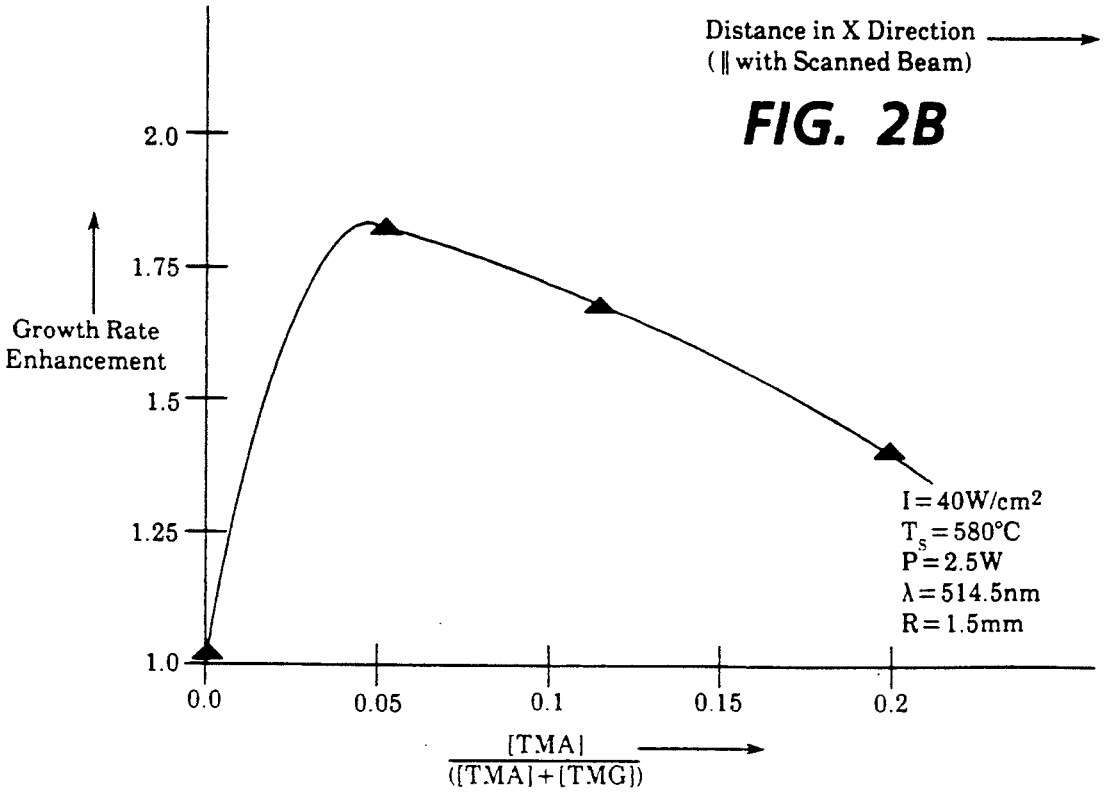
FIG. 3 is a graphical illustration of growth rate enhancement of GaAlAs as a function of different gas transport rate ratios.

FIG. 3 is a graphic illustration of the degree of enhancement obtained in the growth rate of GaAlAs on the growth surface of substrate 14 as a function of the TMA gas transport ratio. Growth rate enhancement is illustrated as a ratio of the film thickness so that a magnitude in the increase in the thickness of film 34A translates to per cent enhancement of film thickness due to the percentage of Al in the TMA transport rate ratio.

As is evident from FIG. 3, small changes in the transport rate ratio from no TMA to very small ratios of TMA greatly enhanced the growth rate of the GaAlAs film 34A in the presence of beam 26. For the particular data here, the intensity of the beam was 4O W/cm$^2$, the substrate temperature, $T_s$, was about 580° C., the laser power was 2.5 W, the wavelength of beam 26 was 514.5 nm and the radius of the laser spot was 1.5 mm. FIG. 3 illustrates that with increases of the TMA transport rate ratio from 0 to about 0.03 during irradiation of the growth surface by beam 26, the growth rate is enhanced in excess of 75% at $T_s$=580° C. From a ration of about 0.03 to about 0.2, the percentage of enhancement slowly drops off.

FIG. 4 is a graphic illustration of the degree of increase in Al molar fraction or Al content in stoichiometric GaAlAs both in the presence and in the absence of laser irradiation as a function of the TMA gas transport rate ratio. For the particular data here, the intensity of the beam was 4O W/cm$^2$, the substrate temperature, $T_s$, was about 580° C., the laser power was 2.5 W, the wavelength of beam 26 was 514.5 nm and the radius of the laser spot was 1.5 mm. This data shows that with no irradiation at curve 36 versus with irradiation at curve 38 during the deposition of the GaAlAs film, the Al molar percentage increased from 4% to 8% with a gas stream containing about 6% TMA. The energy bandgap of the GaAlAs film was found to increase from 1.475 to 1.52 eV over a 4 mm range, with a spatial dependence that resembles the intensity profile of laser beam 26.

In connection with curve 36 in FIG. 4, at the time of filing of this application, data was not complete for curve 36 so that portion 36A of curve is an extrapolation based upon preliminary data relative to other testing Al content versus TMA gas transport rate ratio and that further data based upon different optical intensities between ON (curve 38) and OFF (curve 36) beam states would verify a family of curves similar to curve 38 for different laser beam intensities demonstrating a monotonic increase in Al molar percentage for a given TMA transport rate ratio with a monotonic increase in beam intensity. In any case, curves 36 and 38 clearly demonstrate that with an optical intensity equal to zero, Al molar percentage incorporation in stoichiometric GaAlAs at the growth surface is about 4%. However, with an optical intensity equal to 5O W/cm$^2$, Al molar percentage incorporation in stoichiometric GaAlAs is about 8%. Thus, a selected Al content can be obtained over a 4% range of different possible Al incorporation levels in situ, as-grown GaAlAs by selecting the proper laser beam intensity between, for example, 40–150 W/cm$^2$ for a given transport rate ratio or percent TMA in the gas stream and a given beam spot size or, on the other hand, the transport rate ratio may be varied for a given TMA flow rate or beam intensity or both may be selectively varied to obtain the desired Al incorporation. With respect to the latter mentioned selective variation, the percent TMA or the TMA ratio and the optical intensity of beam 26 or just the beam intensity may be monotonically increased or decreased to respectively provide a monotonic increase or decrease in Al molar incorporation at selective regions at the growth surface to change the optical properties of the as-grown GaAlAs film.

Laser beam 26 can, therefore, be effectively employed to spatially pattern the geometry of the deposited GaAlAs film, e.g. film thickness, and the deposition rate of the epitaxy process with a view toward control of the percent TMA in the TMA transport rate ratio. Furthermore, the optical intensity of the beam may be varied as laser beam 26 is scanned across the growth surface to effectively vary the Al molar content of the GaAlAs film.

Figure 5:
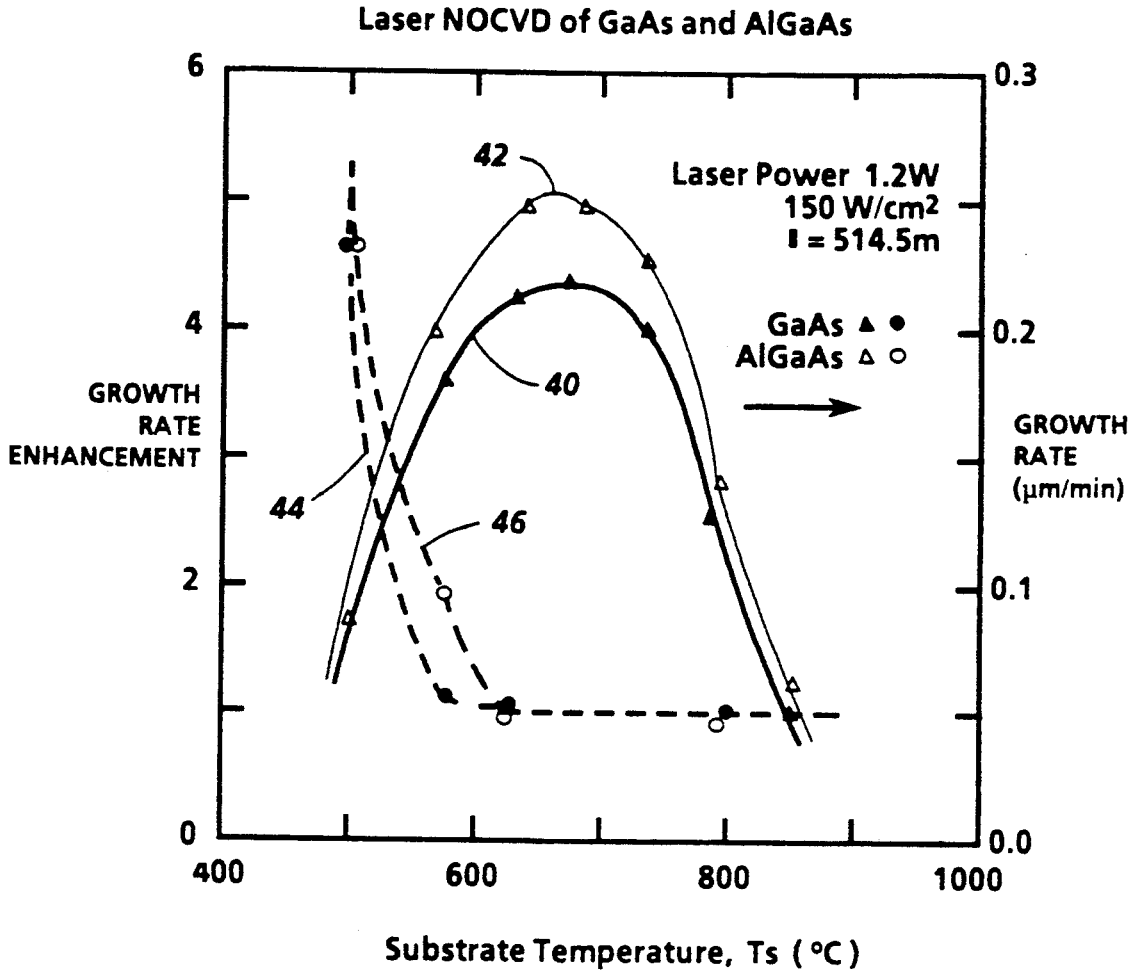
FIG. 5 is a graphical illustration of growth rate enhancement and of laser induced growth rate enhancement of both GaAs and GaAlAs as a function of substrate temperature.

In FIG. 5, the solid curves 40 and 42 respectively show the GaAs and GaAlAs deposition rates in the irradiated portions of substrate 14 as a function of substrate temperature, $T_s$, in the case of a 1.2 W beam focused to a 1.0 mm spot size with a beam intensity 15O W/cm$^2$. An important observation is that laser enhanced growth of the GaAlAs film is observed for $T_s$ less than 610° C. and the growth rate of the GaAs film is increased for $T_s$ less than 565° C. For the growth of GaAs, the partial pressures of the arsine ($AsH_3$) and the TMG were 0.01 and $8.5\times10^{-4}$ atm., respectively. For growth of the $Al_xGa_{1-x}As$ ($x\sim0.4$), TMA is added to give a partial pressure of $2.5\times10^{-4}$ atm. The total $H_2$ flow was approximately 4 l/m and the MOCVD system was operated at atmospheric pressure. As indicated in FIG. 5, the growth rate is of a maximum value, i.e., about 0.2 μm/h at 680° C. and monotonically decreases for both higher and lower substrate temperatures. Above substrate temperatures of 680° C., $(GaAs)_n$ particulates form upstream from the substrate 14, such as at point 30 in chamber 10 of FIG. 1. The particulate formation depletes the concentration of the source molecules in the gas stream in chamber 10 thereby reducing the growth rate. At these elevated temperatures, the growth rate is diffusion limited, i.e. limited by the arrival rate of the source molecules or atoms to substrate 14. Below substrate temperatures of 680° C. no particulate formation is observed and the deposition is limited the reaction rate of the source molecules. Only in this kinetically limited regime does the laser illumination affect the MOCVD growth process.

In FIG. 5, the dashed curves 44 and 46 show the growth rate enhancement respectively for GaAs and GaAlAs deposited films, based upon the ratio between the irradiated and unirradiated deposition rates. As the substrate temperature is reduced to below about 600° C., the enhancement in growth rate increases such that the growth rate is approximately maintained at the diffusion-limited rate. Most importantly, it is to be noted that the maximum substrate temperature for enhanced GaAlAs growth at about 610° C. is greater than the maximum temperature for enhanced GaAs growth at about 565° C. Also, electroluminescence spectra and photovoltaic spectroscopy measurements indicate that the Al incorporation is increased in the GaAs film with the presence of laser radiation if the substrate temperature is in the range of about 565° C. to 610° C. Laser beam 26 can, therefore, be effectively employed to spatially pattern the energy bandgap and thickness of a crystal layer by controlling the Al composition or content and deposition rate of the epitaxy process with a view toward control of substrate temperature within a specified temperature range. The mechanism by which the MOCVD process is altered by laser beam 26 is largely photochemical, the local temperature rise at substrate 14, due to the presence of beam 26, is estimated to be less than 40° C.

Employing the treatment process using beam 26, a multiple wavelength LED bar was fabricated by applying the laser enhanced Al incorporation into the active region of a standard double heterostructure diode structure. The diode structure is shown at 50 in FIG. 6. The method of this invention is employed to selectively irradiate regions of the growth surface with different or varied laser beam intensities to selectively vary the Al incorporation during epitaxial growth to form a monolithic bar of LEDs emitting at different wavelengths. FIG. 6 illustrates bar structure 50 and its selective metallization pattern applied in order to separately access lateral (X direction) regions of the structure possessing different bandgap material of GaAlAs in active region 58. In structure 50, the bandgap of active region 58 has been controlled in the X direction by exposing a 3 mm beam spot size to the surface of growth during the epitaxial deposition of active region 58. The Gaussian shaped intensity profile of the spot was such that its center was over position (a), its approximate midpoint was at position (b) and position (c) was outside the intensity profile of the beam.

In processing, a n-GaAs substrate is placed on susceptor 12. First, the n-type, Se-doped layers of a 1 μm GaAs buffer layer 54 and a 2 μm $Al_{0.4}Ga_{0.6}As$ confining or cladding layer 56 are epitaxially grown at a normal MOCVD growth temperature of $T_s$ equal to 800° C. Then, substrate temperature, $T_s$, is reduced to 580° C. The following gas mixture, which is appropriate for $Al_xGa_{1-x}As$ ($x\sim0.04$), is introduced into chamber 10: TMG, $4.3\times10^{-4}$ atm; TMA, $3.1\times10^{-5}$ atm; $AsH_3$, 0.01 atm, with the balance $H_2$. The $Ar^+$ laser beam (514.5 nm, $TEM_{00}$) had a power level of about 2.4 W with a spot size of 3 mm. After growth of an active region 58 approximately 100 nm thick, the temperature, $T_s$, is raised and returned to 800° C. to deposit the P-type, Mg-doped layers of a 1 μm $Al_{0.4}Ga_{0.6}As$ layer 60 and a 0.2 μm GaAs cap layer 62. Structure 50 is removed from the MOCVD reactor, thinned and metallized as is known in the art. The p-type metallization on cap layer 62 is evaporated through a titanium mask with 9 mil openings on 20 mil centers forming a pattern of stripes 64. The bottom of substrate 52 is also metalized as indicated at 66. By cleaving 20 mil wide bars perpendicular to the pattern of stripes 64, a bar of electrically isolated 9×20 mil sections are formed. Each section may be independently operated and has a different emission wavelength.

Figure 7:
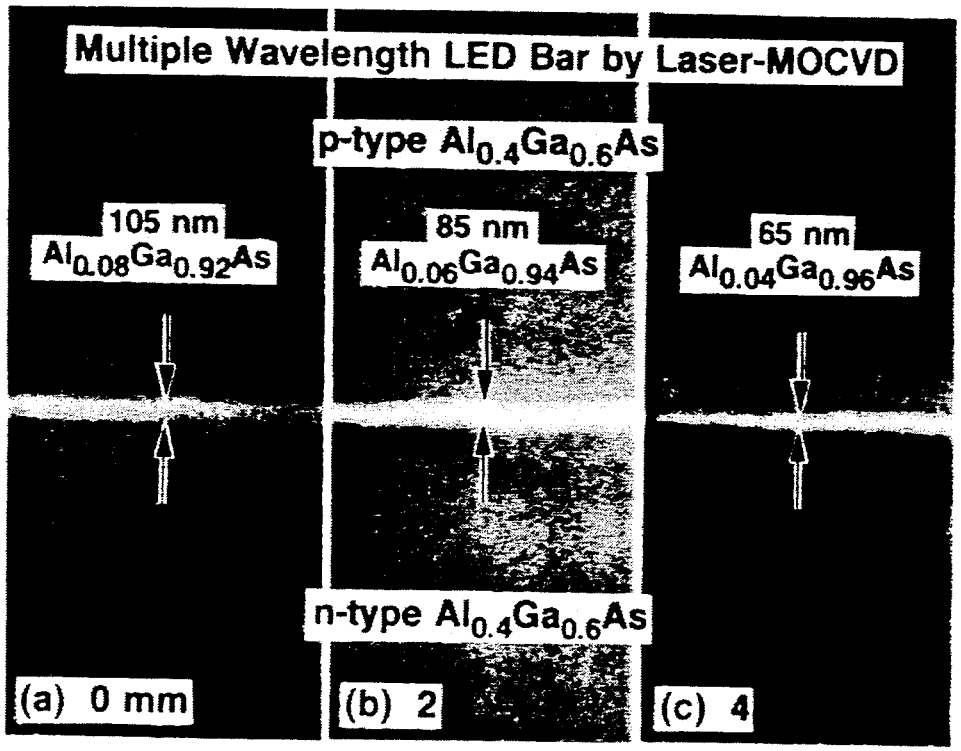
FIG. 7 is a SEM image of a cross section of three regions (a), (b) and (c) of the LED array shown in FIG. 6.

The cross sections of the active layer for three different bar sections are shown in the SEM image of FIG. 7 relative to a single 3 mm laser beam spot. In the center position of the laser spot is shown at (a), active region 58 is 105 nm thick with a composition of $Al_xGa_{1-}As$ where x is about 0.08. Approximately 2 mm away from the spot center at position (b), where the laser intensity and its profile is reduced, active region 58 is only 85 nm thick and is composed of $Al_xGa_{1-x}As$ where x is about 0.06, representing an intermediate Al composition. Away from and outside of the laser spot, 4 mm away from center position at (a), which is an unirradiated region of structure 50 during processing and designated position (c), active region 58 is 65 nm thick and is comprised of $Al_xGa_{1-x}As$ where x is about 0.04. The growth rate enhancement from position (c)to (a) is approximately 80% and the Al molar percentage is increased from 4% to a maximum 8%. Thus, the laser power of 2.4 W in a 3 mm diameter spot increases the growth rate by approximately 80% and increases the Al composition of the epitaxial material from 4% to 8%, as is supported from the data of FIGS. 3–5.

Figure 8:
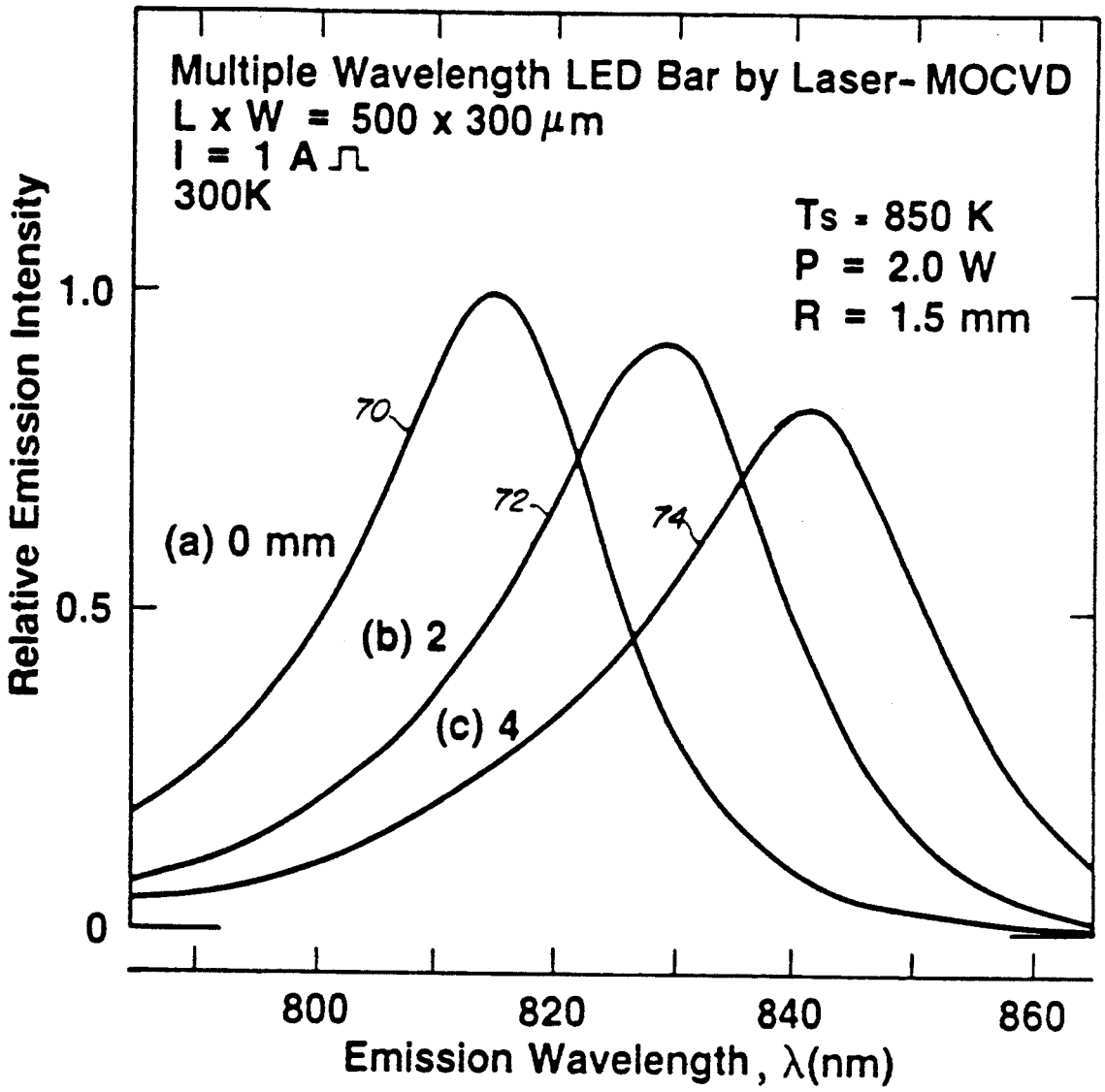
FIG. 8 is an electroluminescent spectra of the three regions (a), (b) and (c) of the LED array shown in FIG. 7.

In FIG. 8, the spontaneous electroluminescence spectra from the three positions (a), (b) and (e) of FIG. 7 are shown. Curve 70 is the emission spectrum from structure 50 at the center of the irradiated laser spot. The emission maximum or peak is at 815 nm, which corresponds to $Al_xGa_{1-x}As$ where x is approximately 0.08. Curve 72 is the emission spectrum for the position (b) 2 mm away from the peak laser intensity of the spot. The spectrum exhibits an intermediate emission wavelength of 828 nm, corresponding to $Al_xGa_{1-x}As$ where x is approximately 0.06. Curve 74 is taken from a position 4 mm away from the laser spot center and corresponds to a baseline value for the emission wavelength of structure 50 wherein the observed emission peak is 842 nm, which is consistent with $Al_xGa_{1-x}As$ where x is approximately 0.04. The short wavelength side of the emission spectrum is attenuated, perhaps due to internal absorption of structure 50. However, as measured by a Si p-i-n detector, the integrated emission intensity of the three sections are approximately equal. Thus, the spectrum of the laser assisted epitaxy at position (a) is more sharply peaked and has a greater maximum intensity than the unassisted epitaxy at position (c). The emission maxima of (a) 815 nm, (b) 828 nm, and (c) 842 nm correspond to an Al composition of approximately 8%, 6%, and 4%, respectively so that it is clear that the bandgap of GaAlAs active region 54 is greater at the center position (a) than its edge positions (b) or (c).

Figure 9:
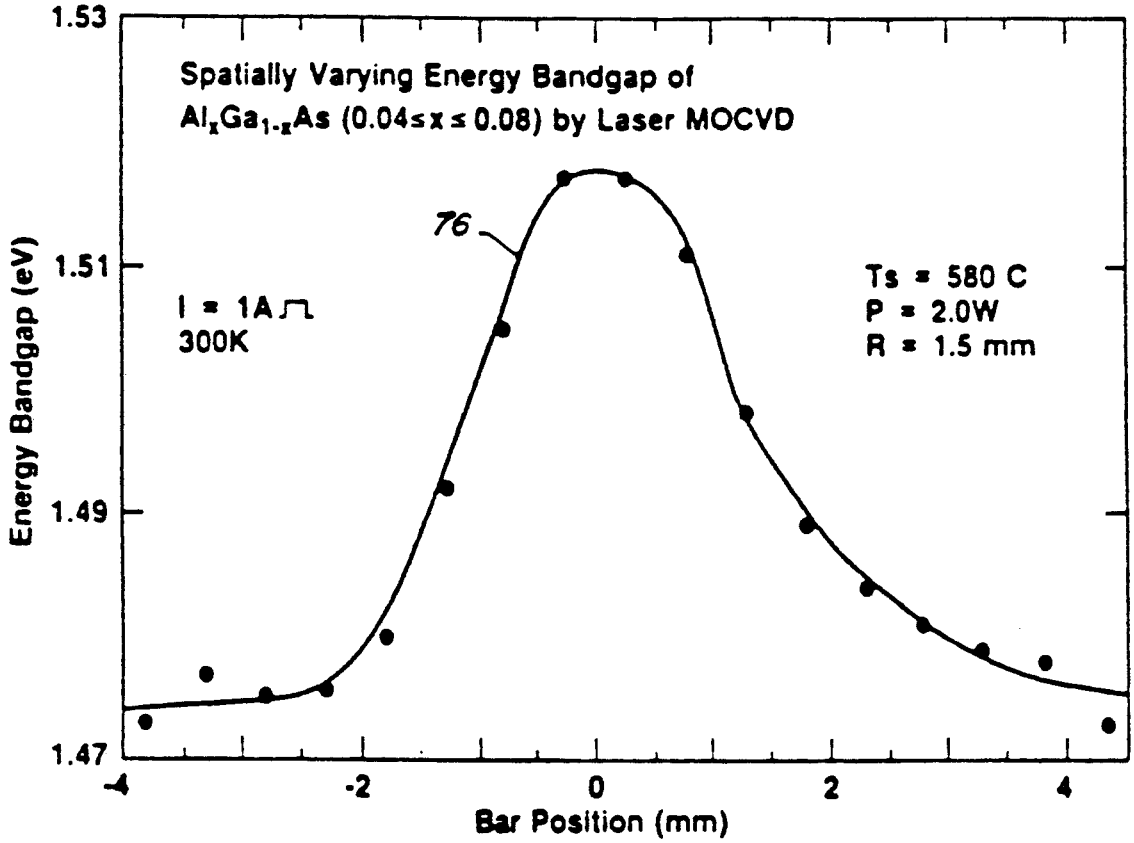
FIG. 9 is a spatial profile of the photon energy of the electroluminescence peak of the multiple wavelength LED array shown in FIG. 6.

In FIG. 9, the energy bandgap, determined by electroluminescence, as a function of position on structure 50 is shown. Each data point or curve 76 represents the emission spectrum from a different individually addressed section laterally across structure 50. The spatial variation in emission energy corresponds to the intensity profile of laser beam 26. The bandgap increases from 1.475 eV to 1.52 eV over a range of 4 mm. The bandgap dependence approximates the gaussian shape of laser beam 26 and both the beam spot and bandgap spectrum exhibit an approximately 3 mm spot size.

From the forgoing, particularly the data of FIGS. 7–9, it can be seen that the dependence of Al content in the ternary, GaAlAs, is controllable by irradiation and, further, the amount of Al incorporation may be employed to effectively vary the bandgap of the as-grown material in the direction of the scanned laser beam 26 by also varying the optical power of the beam as the same is scanned across substrate 14. This effect would be employed in a straight forward manner in fabricating index and bandgap graded structures during growth without requirement of varying the gas flow composition in the MOCVD reactor, in particular, the TMA transport rate ratio. A fundamental example would be an array of stripe geometry lasers wherein each laser emits at a substantially different wavelength. Also, by keeping the Al composition in a region approximately uniform but varying the composition from the lateral region to region, monolithic arrays of diode lasers can be fabricated in which each subarray emits at a different wavelength determined by the Al content of its active region. Such multiple wavelength laser arrays based on the same effect are useful for many applications, such as, wavelength multiplexing, continuously tunable spectroscopic sources, and unique forms of multiple wavelength detectors.

Figure 10:
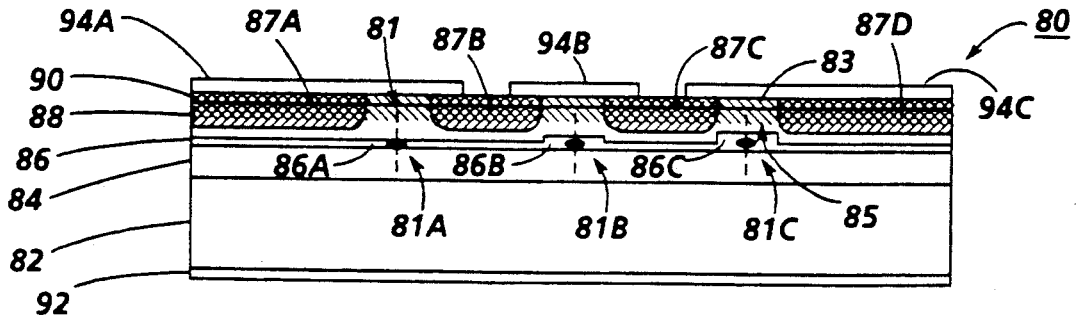
FIG. 10 a schematic illustration of a side elevation of an array laser with multiple wavelength emitters.

In FIG. 10, there is shown an example of an array laser 80 which may be fabricated according to the techniques of this invention. Array laser 80 has three separate emitters 81A, 81B and 81C radiating at different wavelengths. Laser 80 may be comprised of a substrate 82 upon which are deposited the following layers or regions using the MOCVD reactor shown in FIG. 1: a cladding layer 84 of n-$Ga_{1-x}Al_xAs$; an active region 86 being undoped, or p-type doped or n-type doped and can comprise a relatively thin conventional double heterostructure (DH) active layer or a single quantum well of either GaAs or $Ga_{1-y}Al_yAs$ where y is very small and $x>y$ or a multiple quantum well structure of alternating well layers of GaAs or $Ga_{1-y}Al_yAs$ and corresponding barrier layers of either AlAs or $Ga_{1-y'}Al_{y'}As$, where x, $y'>y$ or a separate single or multiple quantum well structure in a separate confinement cavity; a cladding layer 88 of p-$Ga_{1-z}Al_zAs$ where x, z, $y'>y$; and cap layer 90 of p+GaAs.

In the case of active region 86, the particular embodiment shown discloses a single quantum well layer which may be, for example, 6 nm thick and may be comprised of either GaAs or $Ga_{1-y}Al_yAs$. During the growth of active region 86, laser beam 26 is scanned in the longitudinal direction of the structure, i.e., out of the plane of the figure, forming thicker, longitudinal GaAs regions 86B and 86C. No irradiation from beam 26 is employed at longitudinal region 86A. By varying either intensity of the beam, in the case of GaAs or $Ga_{1-y}Al_yAs$, and/or the TMA transport rate ratio, in the case of $Ga_{1-Aly}As$, variations in the region thickness can be obtained as well as an increase in the molar fraction in the case of $Ga_{1-y}Al_yAs$. In the case here, higher beam intensity is imposed upon beam 26 during its scan along longitudinal region 86C, compared to longitudinal region 86B, in order to obtain greater growth rate enhancement and, therefore, a thicker active region, e.g., GaAs, or, in the case of $Ga_{1-y}Al_yAs$, also an increase in Al content. A dual beam scanner may be utilized to perform this photo assist treatment of regions 86B and 86C during the growth of region 86.

Upon completion of the deposition of cap layer 90, a p-type zinc diffusion 83 is performed across the entire surface of the structure to a depth indicated at 85. This provides for good ohmic contact and reduces the series resistance through lasing emitters 81. An electrically insulating barrier is then selectively performed as shown in FIG. 10 at 87A, 87B, 87C and 87D by means of, for example, a proton bombardment to a depth beyond that of zinc diffusion 83 forming current pumping channels for emitters 81. Bombardment 87B and 87C between lasing emitters 81 is important in providing electrical isolation between these sources. Laser 80 is completed by metallization comprising substrate contact 92 and separate contacts 94A, 94B and 94C for independently pumping emitters 81A, 81B and 81C.

As an example of an array laser 80, take the case of a layer of $Ga_{1-y}Al_yAs$, for example, employed in active region 86 exhibiting quantum size effects. Region 86C, which is a larger region due to a high beam intensity and larger TMA transport rate ratio, may be an approximately 8% Al alloy having a bandgap, $E_g$, of about 1.515 eV with a thickness of about 105 nm and an operating wavelength of 816 nm; region 86B, which is a smaller region due to a lower beam intensity and lower TMA transport rate ratio, may be an approximately 6% Al alloy having a bandgap, $E_g$, of about 1.492 eV with a thickness of about 85 nm and an operating wavelength of 828 nm; and region 86A, which is a planar region due to no beam irradiation in this region, may be an approximately 4% Al alloy having a bandgap, $E_g$, of about 1.474 eV with a thickness of about 65 nm and an operating wavelength of 842 nm.

Figure 11:
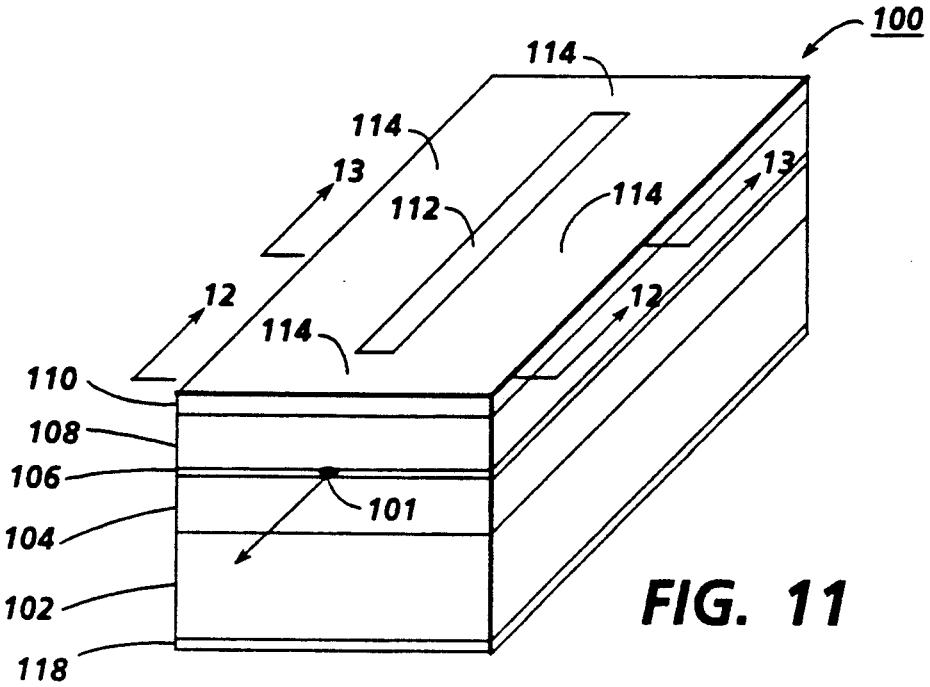
FIG. 11 is a perspective view of a window laser with an active region formed by the method of this invention and having transparent window regions based upon quantum size effect.
Figure 12:
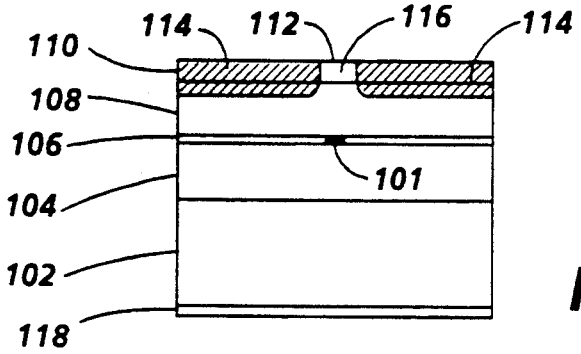
FIG. 12 is a cross sectional view of the laser shown in FIG. 11 taken along the line 12—12 of that figure.
Figure 13:
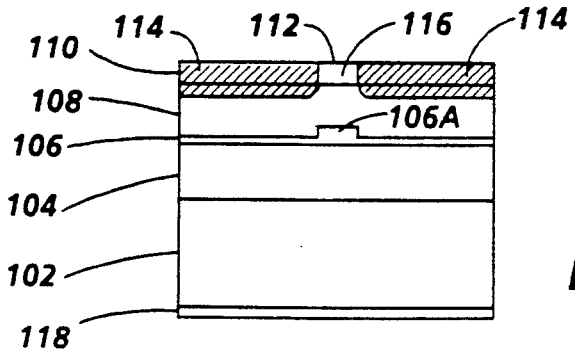
FIG. 13 is a ross sectional view of the laser shown in FIG. 11 taken along the line 13—13 of that figure.

In FIGS. 11-13, there is shown a window laser 100 having a single emitter 101 comprising, for example, a substrate 102 upon which are deposited the following layers or regions using the MOCVD reactor shown in FIG. 1: a cladding layer 104 of n-$Ga_{1-x}Al_xAs$; an active region 106 being undoped, or p-type doped or n-type doped and can comprise a relatively thin conventional double heterostructure (DH) active layer or a single quantum well of either GaAs or $Ga_{1-y}Al_yAs$ where y is very small and $x>y$ or a multiple quantum well structure of alternating well layers of GaAs or $Ga_{1-y}Al_yAs$ and corresponding barrier layers of either AlAs or $Ga_{1-y'}Al_{y'}As$, where $x,y'>y$ or a separate single or multiple quantum well structure in a separate confinement cavity; a cladding layer 108 of p-$Ga_{1-z}Al_zAs$ where x, $z,y'>y$; and cap layer 110 of p+ GaAs. Taking, for example, an active region 106 comprising $Ga_{1-y}Al_yAs$, during its growth laser beam 26 is scanned in the longitudinal direction of the laser structure in a pattern similar to that of stripe 112 forming a enhanced growth region 106A of $Ga_{1-y'}Al_{y'}As$ wherein $y'>y$, which region is also thicker than remaining portions of this layer not subjected to the irradiation of beam 26. As an example, unirradiated regions of layer 106 may be 8 nm thick whereas irradiated region 106A may be 12 nm thick and y may be equal to 0.04 and y' may be equal to 0.08.

Upon completion of the deposition of cap layer 100, a proton bombardment is performed in regions 114, exclusive of the region.,of stripe 112, to a depth that extends into cladding layer 108, as shown in FIGS. 12 and 13 thereby forming a current pumping channel 116. Laser 80 is completed by metallization comprising substrate contact 118 and a cap layer contact, which is not shown.

FIGS. 12 and 13 respectively show a cross section of laser 100 relative to one of the window regions and the active pumping region. As can be seen from FIG. 12, the region of the emitter 101 in layer 106 is sufficiently thin to appear transparent to the propagating radiation. The transparency occurs because active layer 106 in these window regions is so thin that the band structure is changed because of the quantum size effect and radiation produced and propagating in thicker region 106A of the emitter cavity will not be absorbed. Also, the increase in energy bandgap in region 106 vis a vis 106A will provide lateral carrier confinement for region 106A.

Figure 14:
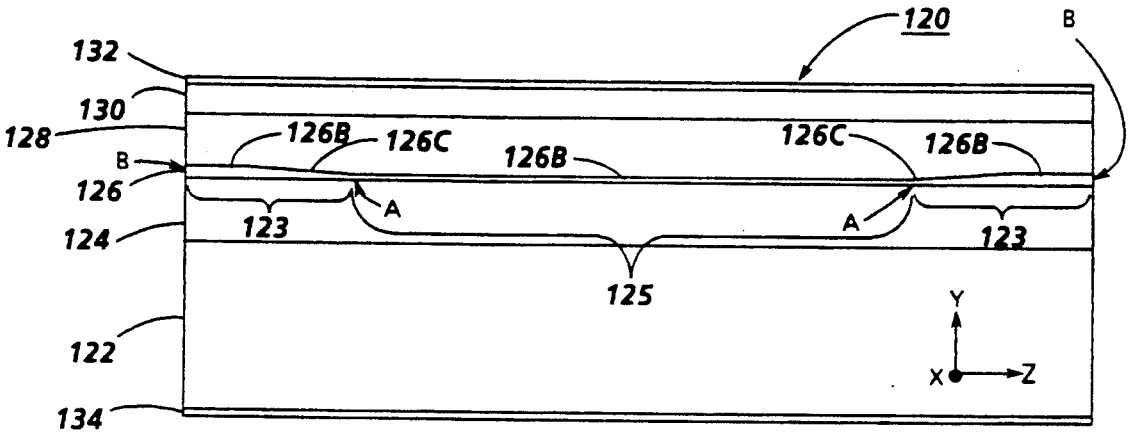
FIG. 14 is a schematic illustration of a longitudinal side elevation of a laser window with transparent window regions formed by the method of this invention.

In FIG. 14, there is shown another window laser structure along its longitudinal axis, i.e, along its optical cavity. Laser 120 comprises, for example, a substrate 122 upon which are deposited the following layers employing the MOCVD reactor shown in FIG. 1: a cladding layer 124 of n-$Ga_{1-x}Al_xAs$; an active region 126 being undoped, or p-type doped or n-type doped and can comprise a relatively thin conventional double heterostructure (DH) active layer or a single quantum well of either GaAs or $Ga_{1-y}Al_yAs$ where y is very small and $x>y$ or a multiple quantum well structure of alternating well layers of GaAs or $Ga_{1-y}Al_yAs$ and corresponding barrier layers of either AlAs or $Ga_{1-y'}Al_{y'}As$, where $x,y'>y$ or a separate single or multiple quantum well structure in a separate confinement cavity; a cladding layer 128 of p-$Ga_{1-z}Al_zAs$ where $x,z,y'>y$; and cap layer 130 of p+ GaAs. Laser 120 is completed by metallization comprising substrate contact 134 and a cap layer contact 132 as is known in the art.

Taking, for example, an active region 126 comprising $Ga_{1-y}Al_yAs$, during the growth of this region, laser beam 26 is scanned in the longitudinal or Z direction of the laser structure in a pattern that includes regions 123 but not region 125. In this case, beam 26 is modulated to be in its OFF state when scanned over region 125 and placed in its ON state when at the boundary of the other region 123 also to be irradiated. The intensity of beam 26 may, further, be modulated as it is longitudinally scanned over regions 123 by varying its intensity from a lower value at point A in regions 123 to a higher intensity which is maintained constant to point B of region 123 or may be set at a given intensity and scanned or vibrated between points A and B. The variation in the intensity of the beam will provide a corresponding variation in the growth rate of the $Ga_{1-y}Al_yAs$, layer as well as a corresponding increase in the Al molar content of layer 126 epitaxially deposited in regions 123, where, for example, the Al content is gradually increased to $Ga_{1-y'}Al_{y'}As$ where $y'>y$. As an example to layer thicknesses, unirradiated regions 126A of layer 126 may be 20 nm thick whereas irradiated region 126B may be 24 nm thick and y may be equal to 0.04 and y' may be equal to 0.08.

Regions 126C at points A form a smooth coupling region between active region 126A and transparent window regions 126C between points A and B. These coupling regions 126C become gradually larger in thickness with a corresponding change in refractive index. The change to $Ga_{1-y'}Al_{y'}As$ in regions 126C is a sufficient change in refractive index to function as a transparent waveguide for radiation generated and propagating in active region 126A. The effect of transparent waveguiding in regions 123 can be a two dimensional or three dimensional creation. In the case of two dimension, the beam scanning in regions 123 is accomplished laterally across the designated areas of window regions, i.e., in the X direction over regions 123, with intensity variation of the beam accomplished in either of the ways explained above. In the case of three dimension, the scanning in regions 123 is accomplished laterally across the designated areas of window regions in the X direction with intensity variation of the beam accomplished in either of the ways explained above and, in addition, variation of beam intensity is periodically increased above previous values to form regions of greater thickness and Al molar content, e.g., $Ga_{1-y'}Al_{y''}As$ where $y''>y'>y$. This is illustrated relative to array laser 120' shown in FIG. 15. Laser 120' is identical in construction to laser 120 in FIG. 14 except that laser 120' is a multiple emitter structure and, further, includes a stair step optical cavity comprising optical waveguide layers 124' of n-$Ga_{1-x'}Al_{x'}As$ and 126' of p-$Ga_{1-z'}Al_{z'}As$ where $x,z>x'z'$, $>y'>y$. Also shown are current confinement means in the form of diffusion regions 129.

Figure 15:
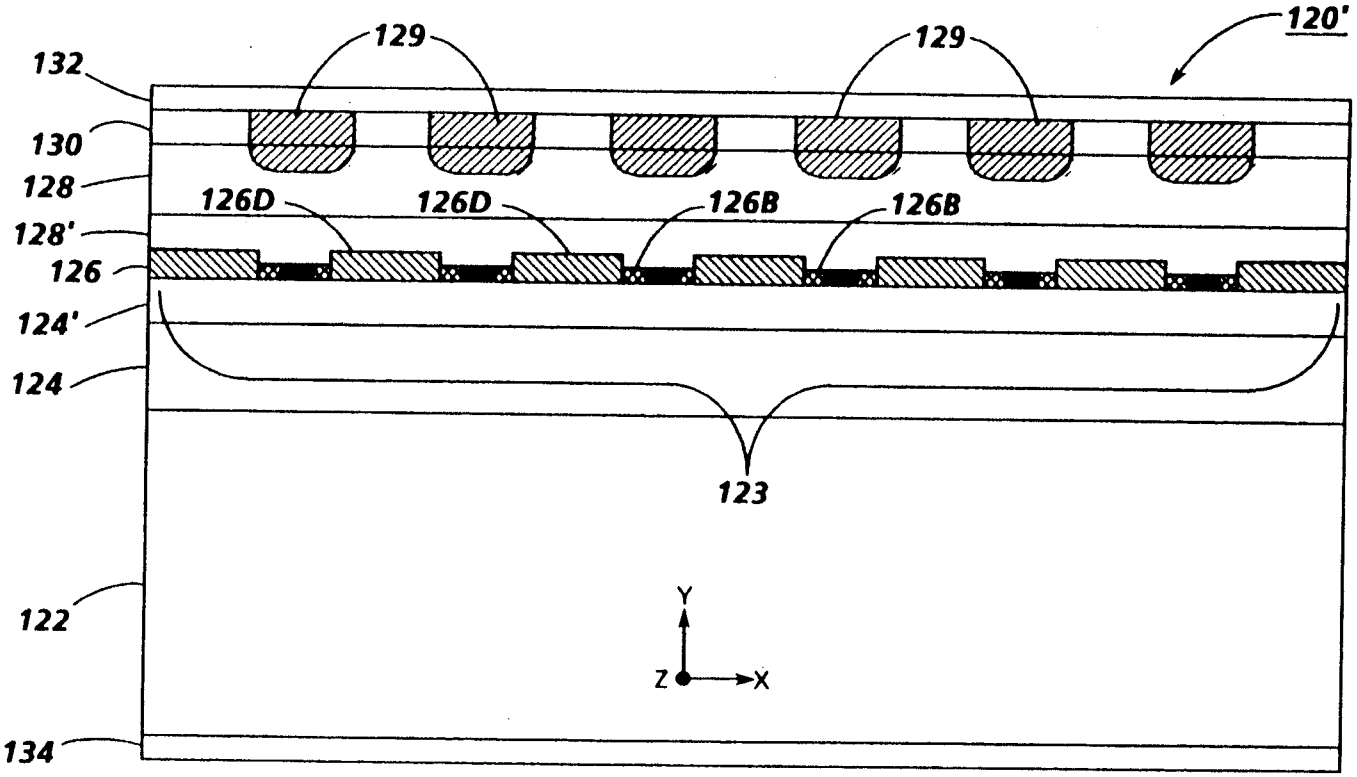
FIG. 15 is a schematic illustration of a side elevation of an array laser having a modified structure of the laser shown in FIG. 14.

In FIG. 15, after the epitaxial deposition of optical waveguide laser 124', a modulated active region 126 is formed by modulating laser beam 26 in the X direction laterally across region 123 while concurrently sweeping the beam longitudinally in the Z direction of region 123. As a result, a periodic modulation in Al content is obtained in region 126 as depicted in FIG. 15 wherein in regions 123, a transparent waveguide region 126B of $Ga_{1-y'}Al_{y'}As$, indicated in light gray scale, are laterally formed and bounded by regions 126D of higher refractive index material of $Ga_{1-y''}Al_{y''}As$, indicated in darker gray scale. Regions 126B are also bounded by layers 124' and 126', respectively of higher refractive index material so that regions 126B are three dimensional transparent waveguides. As an example, regions 126B may be comprised of $Ga_{0.96}Al_{0.04}As$, regions 126D may be comprised of $Ga_{0.92}Al_{0.08}As$, layers 124' and 126' may be comprised of $Ga_{0.70}Al_{0.30}As$ and layers 124 and 126 may be comprised of $Ga_{0.15}Al_{0.85}As$. Regions 126D may be, for example, approximate 24 nm thick while regions 126B may be approximately 20 nm thick. In connection with regions 126B and 126D, the difference in energy bandgap is influenced by a change in Al content between 4% and 8 % rather than by any quantum size effect of active layer 126.

The three dimensional growth technique explained relative to region 123 is equally applicable to active region 126A wherein lateral modulation in the X direction through region 125 will provide a modulated Al content similar to the configuration shown in FIG. 15 for regions 123 except that regions 126A would be of small Al molar fraction compared to regions 126B, i.e., $y'>y$.

Figure 16:
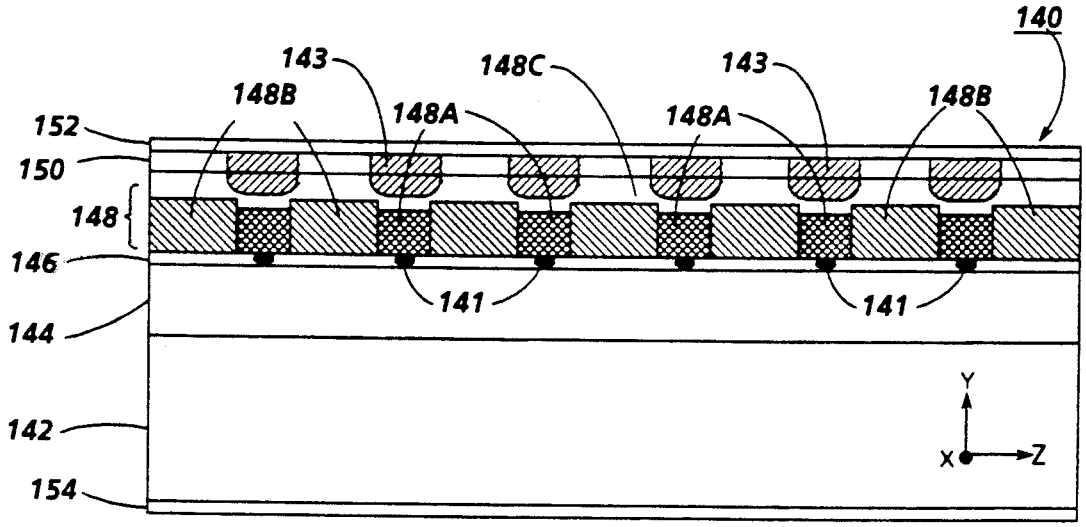
FIG. 16 is a schematic illustration of a side elevation of a laser array with index guiding formed in a cladding layer by the practice of this invention.

FIG. 16 illustrates a further embodiment of an array laser 140 wherein refractive index waveguiding properties, via modulated in situ Al content changes during growth, is provided in a cladding region of an array laser rather than in its active region. Array laser 140 comprises, for example, a substrate 142 upon which are deposited the following layers employing the MOCVD reactor shown in FIG. 1: a cladding layer 144 of n-$Ga_{1-x}Al_xAs$; an active region 146 being undoped, or p-type doped or n-type doped and can comprise a relatively thin conventional double heterostructure (DH) active layer or a single quantum well of either GaAs or $Ga_{1-y}Al_yAs$ where y is very small and $x>y$ or a multiple quantum well structure of alternating well layers of GaAs or $Ga_{1-y}Al_yAs$ and corresponding barrier layers of either AlAs or $Ga_{1-y'}Al_{y'}As$, where x, $y'>y$ or a separate single or multiple quantum well structure in a separate confinement cavity; a cladding layer 148 of p-$Ga_{1-z}Al_zAs$ where $x,z,y'>y$; and cap layer 150 of p+GaAs. Laser 120 is completed by metallization comprising substrate contact 154 and a cap layer contact 152 as is known in the art. Also shown are current confinement means in the form of diffusion regions 143.

After the growth of active region 146, a modulated cladding region 148 is formed by modulating the beam intensity and/or dwell time of laser beam 26 in the X direction laterally across the structure while concurrently sweeping the beam longitudinally in the Z direction for the full length of the structure. As a result, a periodic modulation in Al content is obtained in region 148 as depicted in FIG. 16 wherein regions 148A of $Ga_{1-z'}Al_{z'}Al_{z'}As$, indicated in light gray scale, are laterally formed and bounded by regions 148B of higher Al content due to greater beam intensity at this point in beam scanning and comprising $Ga_{1-z''}Al_{z''}As$, indicated in darker gray scale, where $x,z>z''>z'>y'>y$.

Regions 148A and 148B run longitudinally in the Z direction for the full length of the structure. Regions 148B, having higher Al content than adjacent regions 14A, possess higher refractive index properties so that regions 12A function as optical waveguides for propagating radiation in active region 146 indicated by emitters 141. As an example, waveguide regions 148A may be comprised of $Ga_{0.60}Al_{0.40}As$, regions 148B may be comprised of $Ga_{0.40}Al_{0.60}As$, and the remaining portions 148C of region 148 and cladding layer 144 may be comprised of $Ga_{0.40}Al_{0.60}As$.

Relative to the descriptions of the embodiments of FIGS. 10–16, it will be understood by those skilled in the art that in reality, there is generally no actual beam scanning of individual discrete laser structures but rather the scanning of beam 26 under computer control across an entire wafer or substrate 14 wherein the computer is programmed to modulate the intensity, dwell and ON and OFF states of beam 26 as the same is scanned at high velocity from end to end across the growth surface of substrate 14. The beam, therefore, is programmed to follow a pattern creative of multiple aligned laser structures which are subsequently cleaved into die and individual laser devices that are further processed for operation.

Also, in the embodiments of FIGS. 10–16, the geometrical and stoichiometric modifications have been expressed relative to the ternary, GaAlAs. However, the binary, GaAs, is equally applicable to obtain geometrical induced modifications in thickness of layers and modulated thickness changes in regions of layers to produce attributes similar to those previously discussed in connection with these figures.

While the invention has been described in conjunction with a few specific embodiments, it is evident to those skilled in the art that many alternatives, modifications and variations will be apparent in light of the foregoing description. Although all of the foregoing embodiments have been described in connection with semiconductors of GaAs and GaAlAs regime, other III-V alloys may be employed, such as, InGaP, InGaAsP, GaAlAsP, InGaAlP, InGaAlAsP, GaAlSb and other alloy regimes may be utilized in the practice of the invention, such as, II-VI materials, e.g., ZnSe/ZnSSe. Further, as indicated in each embodiment illustrated, the active region may comprise a single active layer or may be comprised of an active region comprising either a single quantum well or multiple quantum well structure. In any of these particular growth regimes in MOCVD, beam 26 may be employed to (1) enhance the growth of the layer or region irradiated, (2) to selectively create larger regions in the as-grown film having different bandgap properties by increasing the molar fraction of the stoichiometric alloy constituent via laser beam irradiation thereby increasing the in situ bandgap of the deposited material or (3) vary the optical intensity of the laser beam as the same is scanned across the growth surface to vary the in situ bandgap of the deposited material. Accordingly, the invention is intended to embrace all such alternatives, modifications and variations as fall within the spirit and scope of the appended claims.

What is claimed is:

1. A method of photo thermal enhanced single crystal epitaxial growth in the deposition of Group III-V compound films comprising the steps of:

a) providing a substrate in an epitaxial growth chamber having a growth surface;

b) heating the substrate to a temperature within the range of about 500° C. to 610° C.;

c) introducing reactant gases into said chamber comprising at least one Group III constituent and at least one Group V constituent such that decomposition of the reactant gases occurs at a selected substrate temperature in said range enabling deposition of a Group III-V compound film at said substrate growth surface; and d) introducing an irradiation source into said chamber directed to selected regions on the substrate growth surface, said source characterized by a wavelength of operation substantially absorptive at the substrate growth surface as opposed to the reactant gases, the growth rate of said compound film within said temperature range in selected regions of the substrate surface illuminated by said source enhanced compared to unilluminated regions thereof whereby said illuminated regions contain a larger layer thickness and/or stoichiometric content compared to said unilluminated regions.

2. The method of photo thermal enhance epitaxy of claim 1 wherein said method has a diffusion-limited rate of growth, and said growth rate enhancement is between 2 and said diffusion-limited rate of growth.

3. The method of photo thermal enhanced epitaxy of claim 1 including the step of selecting a temperature in said range wherein optimized enhanced growth rates are achieved in the presence of said irradiated source to selectively provide different growth rate enhancements of deposition of compound films at spatially illuminated regions during film deposition.

4. The method of photo thermal enhanced epitaxy of claim 1 including the step of selectively controlling the growth rate enhancement of said compound film during its growth by varying said substrate temperature.

5. The method of photo thermal enhanced epitaxy of claim 1 wherein said source is a focussed laser beam, scanning said laser beam across said growth surface while modulating the intensity thereof to selectively increase or decrease the thickness and/or stoichiometric content of selected regions of said compound film as said film is being deposited.

6. The method of photo thermal enhanced epitaxy of claim 5 wherein said monotonic increase or decrease is induced by the profile Gaussian shape of said source spot.

7. The method of photo thermal enhanced epitaxy of claim 1 including the step of modulating the intensity of said source.

8. The method of photo thermal enhanced epitaxy of claim 7 including the step of shaping said laser beam to have a predetermined profile of varying intensity.

9. The method of photo thermal enhanced epitaxy of claim 8 wherein said profile is pseudo Gaussian shaped.

10. The method of photo thermal enhanced epitaxy of claim 1 wherein said source is a focussed laser beam, scanning said laser beam across said growth surface while maintaining constant intensity thereof to selectively increase or decrease the thickness and/or stoichiometric content of selected regions of said compound film as said film is being deposited.

11. The method of photo thermal enhanced epitaxy of claim 1 wherein said source is directed through a patterned mask to form an irradiated pattern on said growth surface.

* * * * *